(12) United States Patent
Mankame

(10) Patent No.: US 6,260,899 B1
(45) Date of Patent: Jul. 17, 2001

(54) CENTRIFUGAL GRIPPER MECHANISM FOR DYNAMIC FORCE COMPENSATION

(75) Inventor: Anil Mankame, Attleboro, MA (US)

(73) Assignee: ADE Corporation, Westwood, MA (US)

( * ) Notice: Subject to any disclaimer, the term of this patent is extended or adjusted under 35 U.S.C. 154(b) by 0 days.

(21) Appl. No.: 09/684,298

(22) Filed: Oct. 6, 2000

Related U.S. Application Data

(60) Provisional application No. 60/158,513, filed on Oct. 8, 1999.

(51) Int. Cl.⁷ .................. B65G 49/07; H01L 21/68
(52) U.S. Cl. .............................. 294/86.4; 414/936
(58) Field of Search ......................... 294/1.1, 86.4, 294/106; 414/936, 941, 935

(56) References Cited

U.S. PATENT DOCUMENTS

| | | | |
|---|---|---|---|
| 4,700,595 | 10/1987 | Soares | 82/165 |
| 4,711,610 | 12/1987 | Riehl | 409/141 |
| 4,892,455 | * 1/1990 | Hine | 414/936 |
| 4,944,650 | * 7/1990 | Matsumoto | 414/936 |
| 5,022,965 | * 6/1991 | Ayers | 414/941 |
| 5,040,484 | 8/1991 | Mears et al. | 118/503 |
| 5,484,252 | * 1/1996 | Mutoh | 414/941 |
| 5,566,466 | * 10/1996 | Hearne | 414/936 |
| 5,642,298 | * 6/1997 | Mallory et al. | 414/935 |
| 5,784,797 | 7/1998 | Curtis et al. | 34/58 |
| 5,810,935 | * 9/1998 | Lee et al. | 414/936 |
| 5,851,041 | * 12/1998 | anderson et al. | 294/106 |
| 5,934,865 | * 8/1999 | Meadows | 414/941 |
| 5,938,902 | * 8/1999 | Nguyen et al. | 414/941 |
| 5,989,642 | * 11/1999 | Ikeda et al. | 414/935 |

FOREIGN PATENT DOCUMENTS

| | | |
|---|---|---|
| 357207571 | * 12/1982 | (JP) . |
| 362101045 | * 5/1987 | (JP) . |
| 401028934 | * 1/1989 | (JP) . |
| 410070162 | * 3/1998 | (JP) . |

* cited by examiner

*Primary Examiner*—Dean J. Kramer
*Assistant Examiner*—Paul T. Chin
(74) *Attorney, Agent, or Firm*—Weingarten, Schurgin, Gagnebin & Hayes LLP

(57) ABSTRACT

A force compensating apparatus is for use in a wafer-handling machine. The wafer-handling machine includes a rotatable rim adapted to be concentric with and external to a wafer, and a plurality of wafer-supporting fingers disposed about the rim. Each finger is supported by a floating arm, part of a support mechanism utilizing first and second fixed arms bracketing the floating arm where the fixed arms attach the support to the rim. Each the finger is preloaded with sufficient force to support the wafer among the plurality of fingers and each the finger is generally positioned in a radial plane with the rim. The force compensating apparatus comprises a fulcrum mechanism on each fixed arm, a first force receiving mass suspended on a rod projecting from the fulcrum in a direction away from the floating arm, a second force receiving mass suspended on a rod projecting from the fulcrum in a radial direction and a force transferring mass suspended on a rod projecting from the fulcrum in a direction toward the floating arm. The fulcrum, first force receiving mass and force transferring mass form a balance with the force transferring mass contacting the floating arm. The second force receiving mass and the force transferring mass form a rigid triangle. The action of the balance transfers a force to the floating arm to balance the centrifugal force on the finger, and the actions of the triangles transfer a force to the floating arm to balance the acceleration and deceleration forces on the finger.

16 Claims, 9 Drawing Sheets

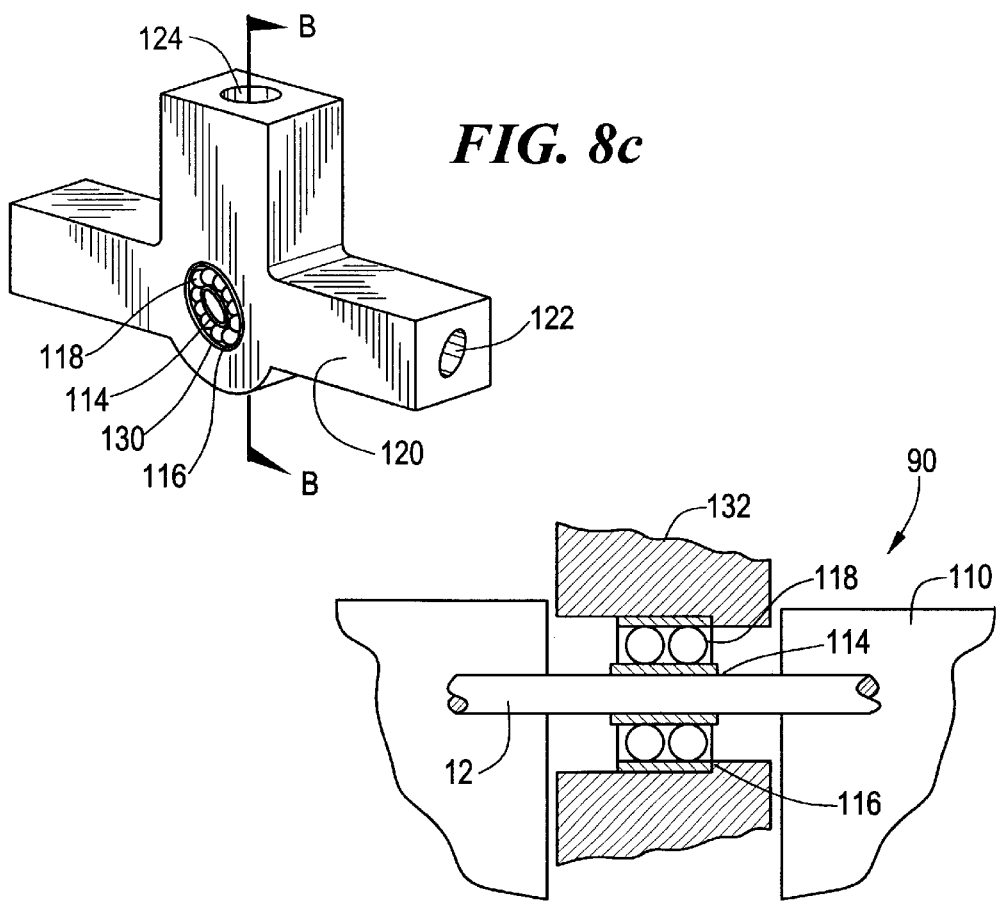
FIG. 8c
FIG. 8d
SECTION B-B
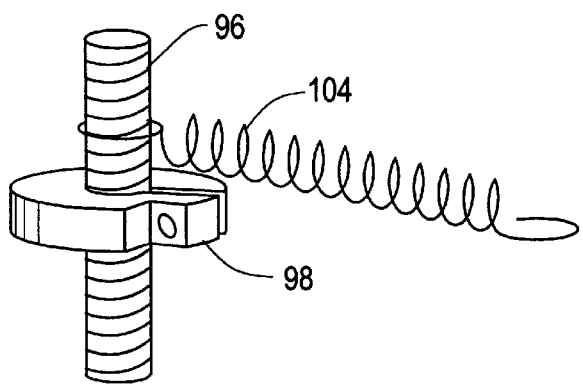
FIG. 8e
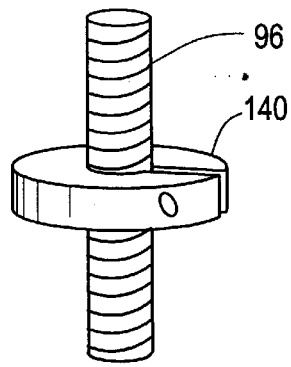
FIG. 8f

US 6,260,899 B1

CENTRIFUGAL GRIPPER MECHANISM FOR DYNAMIC FORCE COMPENSATION

CROSS REFERENCE TO RELATED APPLICATIONS

This application claims priority of U.S. Provisional Patent Application No. 60/158,513 Entitled: CENTRIFUGAL GRIPPER MECHANISM FOR DYNAMIC FORCE COMPENSATION, incorporated herein by reference filed Oct. 8, 1999.

STATEMENT REGARDING FEDERALLY SPONSORED RESEARCH OR DEVELOPMENT

N/A

BACKGROUND OF THE INVENTION

This invention relates generally to wafer handling and more particularly to an improved wafer handling system.

Processing machinery for handling semiconductor wafers is known. Such machinery typically includes the ability to lift and spin the wafers to bring them in proximate distance to testing machinery. It is generally desirable to move the wafers as quickly as possible while keeping the plane of the wafer as flat as possible. While platters and other support mechanisms have been used, increasingly there is a need to handle the wafers by the edges so that both surfaces are accessible.

Handling wafers by the edges has involved compromise among the security of the grip, the speed at which the wafer may be moved and the degree of flatness exhibited by the wafer. The wafer can be securely gripped by increasing the inward force of each finger gripping. However, this action may deform the wafer and cause processing errors due to the distorted profile of the wafer. When a wafer is spun, the centrifugal forces act on the finger grippers. These forces tend to pull the finger grippers away from the wafer. If the pull on the gripper is sufficient, the wafer may slip in the grip causing erroneous measurements or the wafer may be released causing destruction of the wafer. Previous efforts to reduce this effect have included adding additional spring force to grip more tightly and compensate for the centrifugal force. However, this extra force can cause the previously noted deformation. Alternately, an upper speed limit can be placed on the rotation thereby limiting the centrifugal force. This limit slows the production line increasing manufacturing cost.

Thus there is a need to minimize and eliminate the undesired effect of centrifugal force on gripping fingers without distorting the shape of the wafer or allowing the wafer to slip within the grip.

BRIEF SUMMARY OF THE INVENTION

In a wafer processing machine where gripper fingers hold the wafer by the edges and the wafer is spun, the invention compensates for the undesired effect of centrifugal force acting on the gripper fingers. The centrifugal force may reduce the finger gripping force on the wafers to the extent of dropping the wafer. The gyroscopic principle is used to balance out the undesired centrifugal force while maintaining a constant desired minimum gripping force regardless of the rotational speed. In other words the forces generated due to motion of the fixtures is prevented from acting on the wafers. In addition, the invention also compensates for the lessening of force between the wafer and the gripping fingers during the acceleration and deceleration, thereby preventing slipping.

BRIEF DESCRIPTION OF THE SEVERAL VIEWS OF THE DRAWING

The invention will be more fully understood by reference to the following detailed description when considered in conjunction with the accompanying drawings, in which:

FIG. 8c is a detail of the pivot with bearings installed of FIG. 8a;

FIG. 8d is a detail of the journaling of the pivot of FIG. 8c;

FIG. 8e is a detail of the adjustable weights with springs;

FIG. 8f is a detail of the adjustable weights of both embodiments; and

DETAILED DESCRIPTION OF THE INVENTION

Figure 1A:
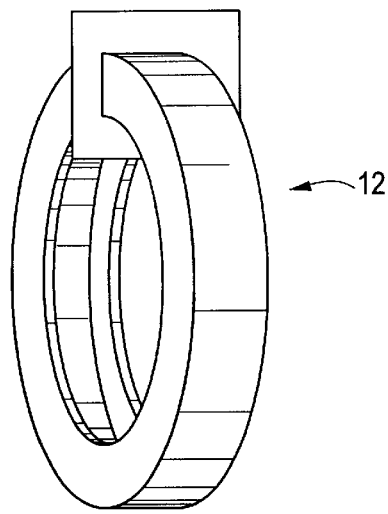
FIG. 1a is a three dinensional representation of the yoke depicted in FIGS. 1b, 4, and 6.
Figure 1B:
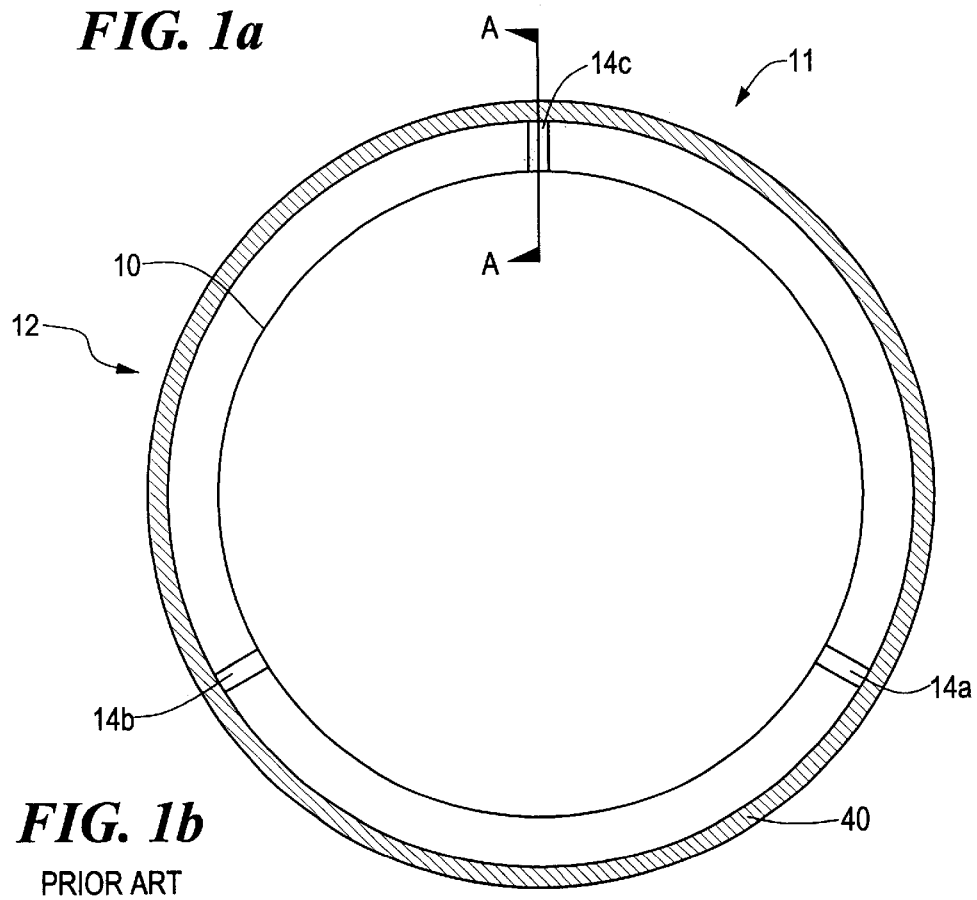
FIG. 1b is a schematic representation of a wafer-handling machine in which the wafer is gripped by the edges.

Referring to FIG. 1b, a measurement station 11 includes, calibration gauges (not shown), three finger grippers 14a, 14b, 14c, air bearing rotor 12, and supporting drive assemblies. The rotor 12 is a yoke that is kept in a well defined and stable plane of rotation by radial support bearings and axial thrust bearings not shown. For insertion and removal of a wafer 10 by a robot, the finger grippers 14 are positioned to locations that prevent interference with the robot. The finger grippers 14 hold the wafer 10 in a plane that is outbound of the face of the rotor 40.

When wafer 10 is loaded onto the measurement station 11, the wafer 10 is securely held in a vertical position by the finger grippers 14a–c. The wafer 10 is then rotationally accelerated at a predetermined rate. When the wafer 10 reaches a target rotation rate, the speed is stabilized and sensors are moved across the wafer 10 in a predetermined pattern to measure wafer characteristics such as conductivity, circuit continuity, and process parameters. After the wafer has been measured, the rotation is stopped and the wafer 10 is removed from the measurement station 11.

Figure 2A:
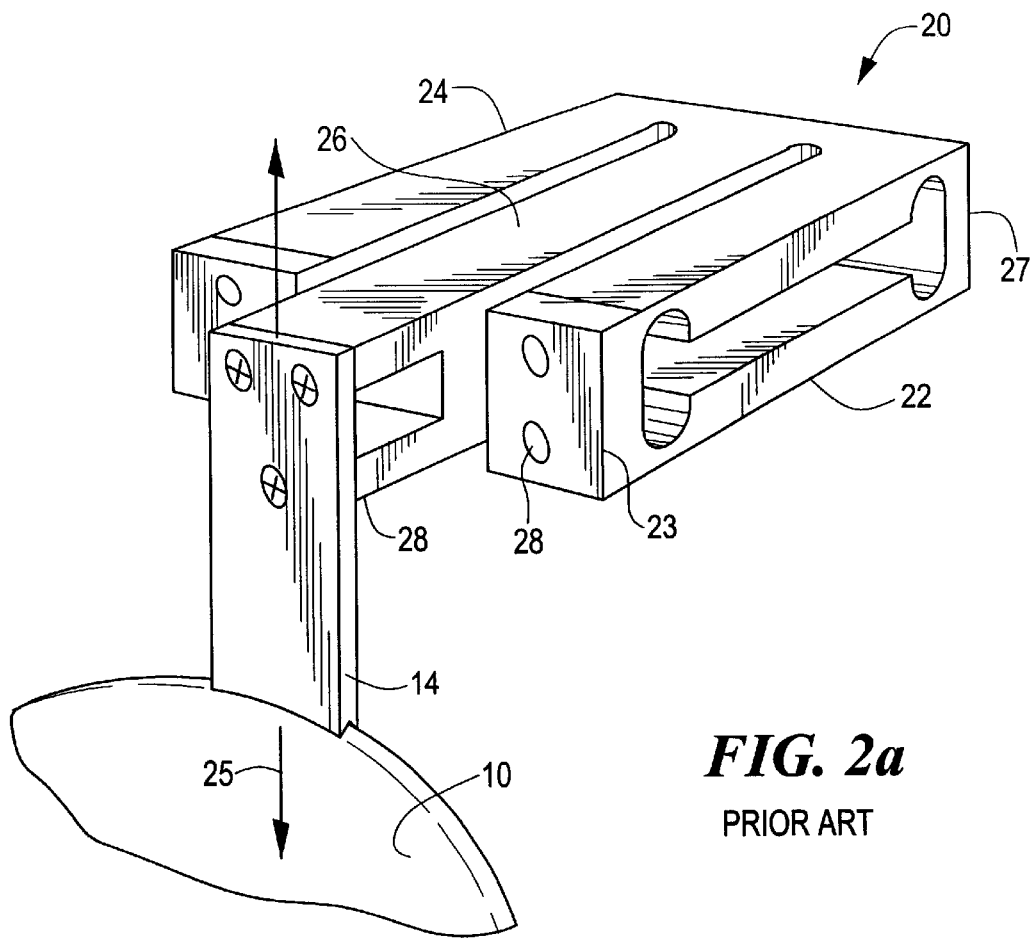
FIG. 2a is a schematic of the mechanism to support the finger.

The finger grippers 14a–c function to hold the wafer 10 in a repeatable position for measurement. In the prior art measurement station, all three finger grippers e.g. 14a–c are stationary during measurement. The finger grippers 14 are attached to support 20 shown in FIG. 2a. The support 20 advantageously allows finger gripper movement only along a single axis 25.

Figure 2B:
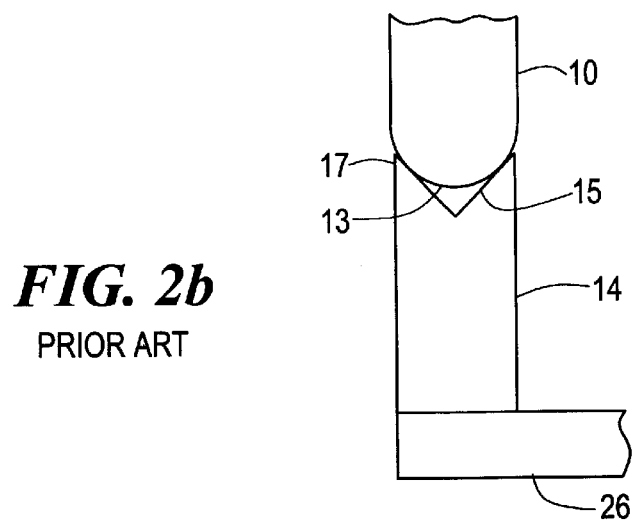
FIG. 2b is a detail of the finger/wafer interface.

The support, as previously described in U.S. Pat. No. 5,456,561, issued Jun. 24, 1997 and commonly assigned, herein incorporated by reference, includes two outer arms 22 and 24 that are adapted to be disposed on the rotor yoke 12 by mounting holes 28 at a first end 23. A floating arm 26 is connected to the outer arms at a second end 27 and is connected to the gripper finger 14 at its first end, thereby forming the W-shaped support 20. When sufficient inward pressure is applied to the floating arm 26, the finger 14 is depressed and the wafer 10 is secured in position. The profile of finger gripper 14 is shown in FIG. 2b. The fingertip 17 encompasses a groove 15 sized so that the rounded edge 13 of the wafer 10 is securely held by the finger tip 17. The wafer gripping edges of the finger gripper 14 are typically provided with grooves to facilitate repeated and reliable gripping.

Figure 3:
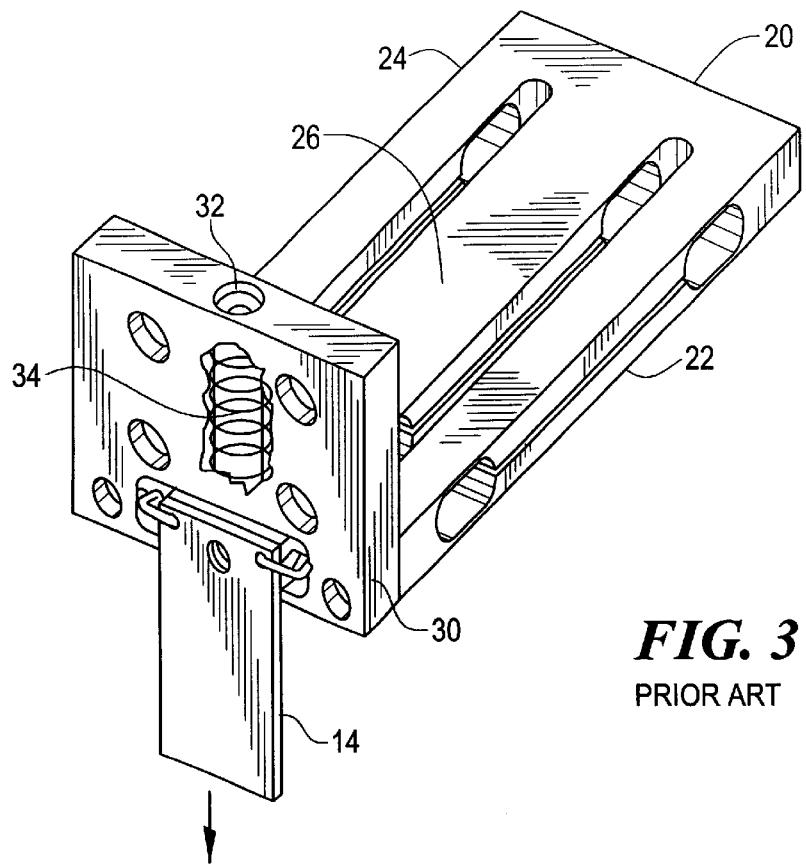
FIG. 3 is schematic detail of the preloading of the finger.
Figure 4:
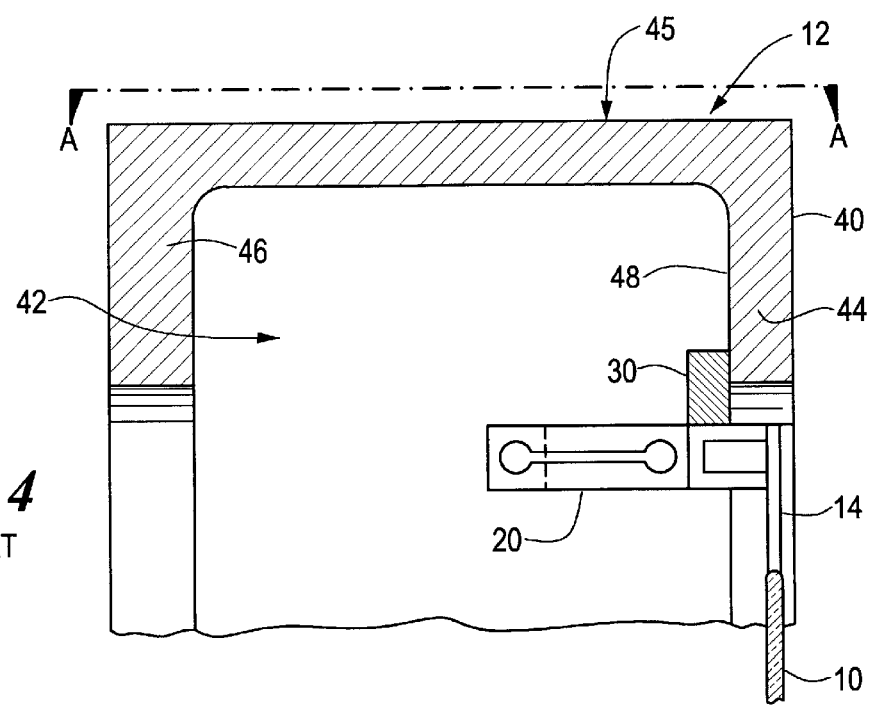
FIG. 4 is a schematic of the mounting of the support system in the rotor cavity before the installation of the invention.

Mounting bracket 30 secures the support to the inner rim of the rotor yoke 12 as shown in FIG. 4. The mounting bracket, as shown in FIG. 3, is secured to the two outer arms 22 and 24 leaving floating arm 26 free. A captive spring 34 is disposed through a hole 32 in the mounting bracket 30. This spring 32 bears against floating arm 26, deflecting it to provide sufficient force to engage the finger gripper 14 with the wafer 10.

Rotor yoke 12 is a U-shaped annular ring. Its front surface 40 is generally in the same plane as a wafer being tested. The two legs 44 and 46 and the outer rim 45 of the rotor yoke 12 define an inner cavity 42. Support 20 is mounted to the inside face 48 of the front leg 44 by the mounting plate 30. The rotor yoke 12 rotates causing the wafer 10 to rotate.

The dynamic force compensation device of the invention is designed to be a fully passive device that automatically adjusts the force exerted on the finger/wafer interface. It is capable of being retrofit in the prior art system previously described as well as in other systems where edge gripping is utilized. Because the compensation system is finger specific, it may be utilized on all or a lesser number of fingers in such an application. When the fingers are displaced to accommodate differently sized wafers, the compensation system may be moved with the fingers.

Figure 5A:
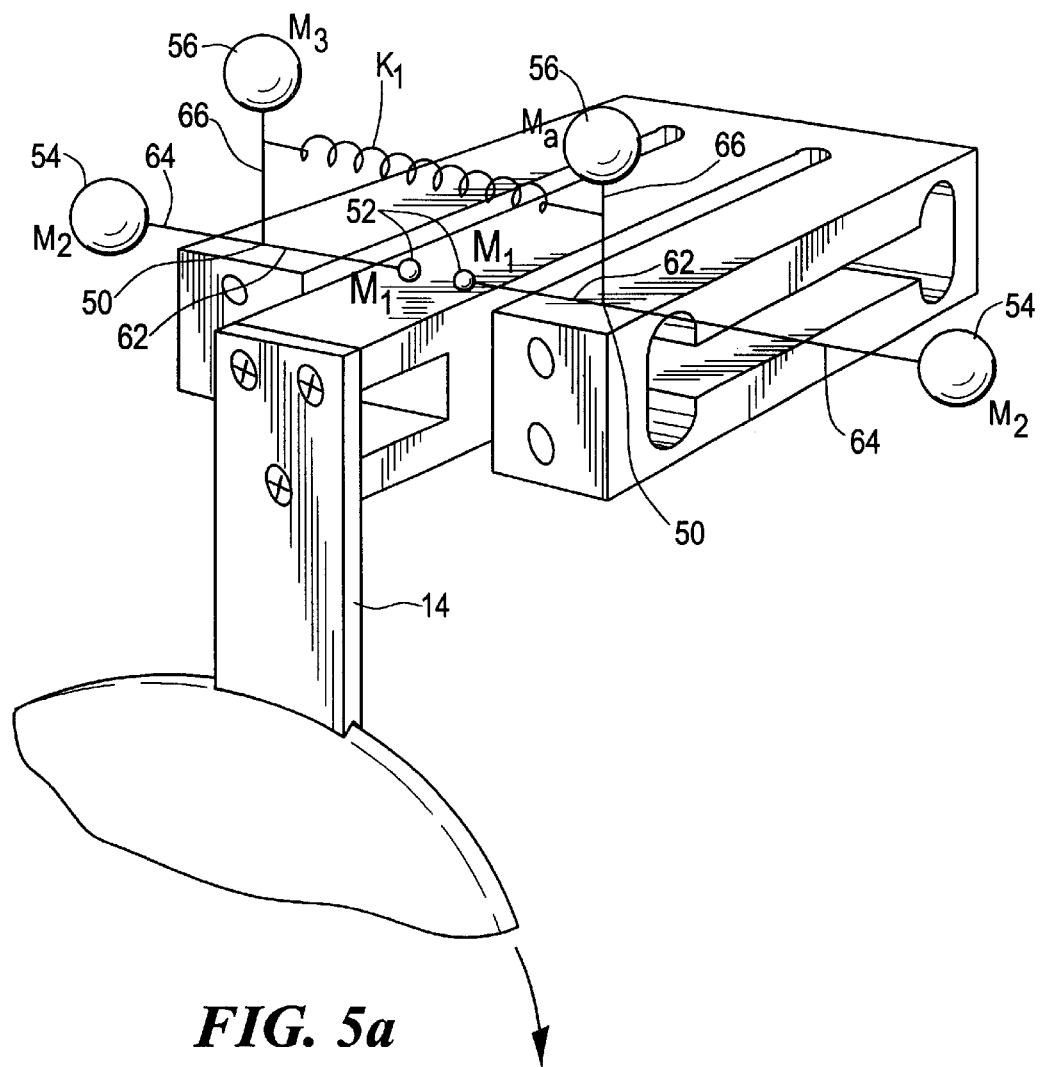
FIG. 5a is a schematic of the dynamic force compensation system and its relation to the support according to the invention.
Figure 5B:
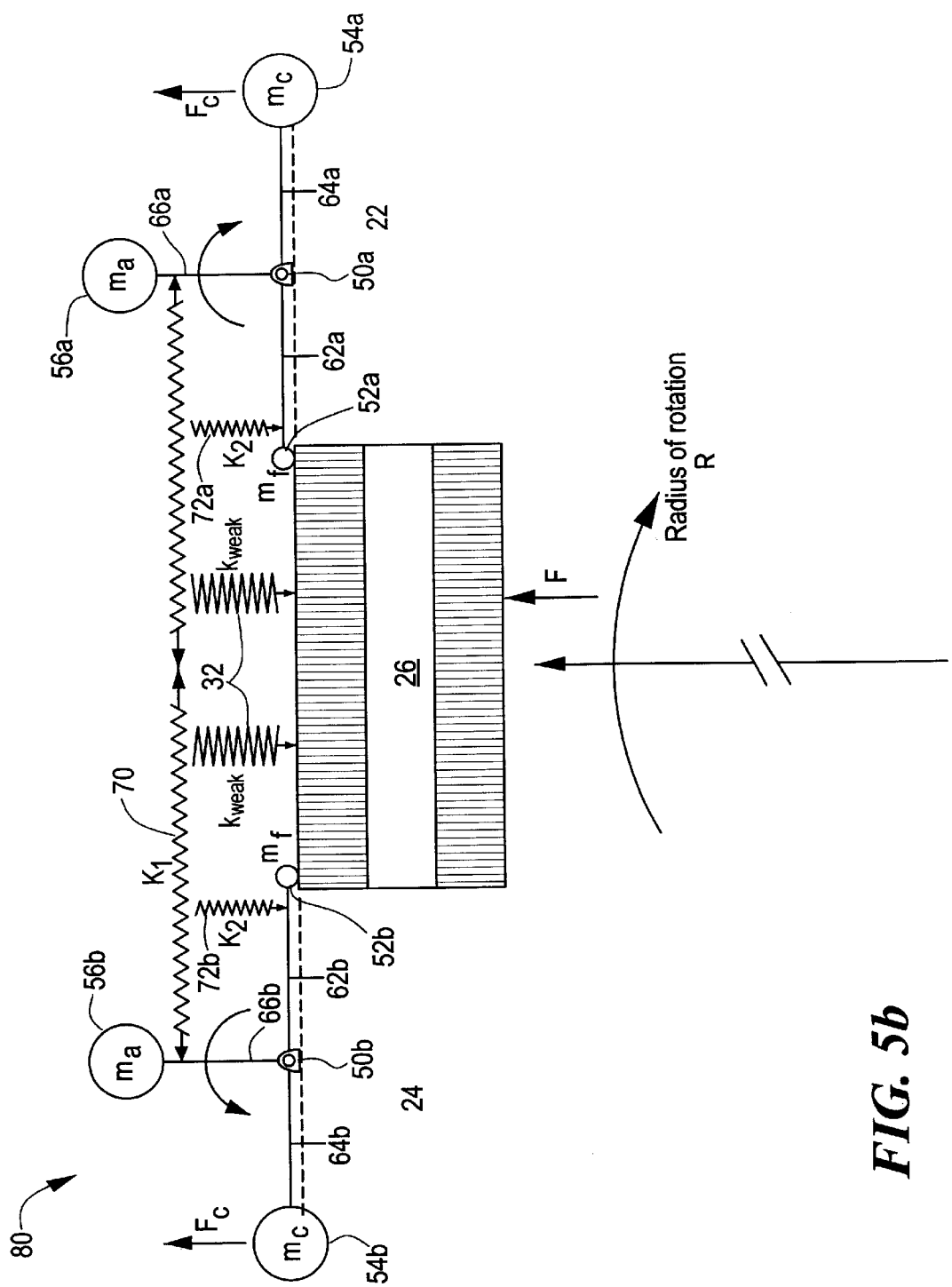
FIG. 5b is a diagram of the dynamic force compensation system according to the invention.
Figure 6:
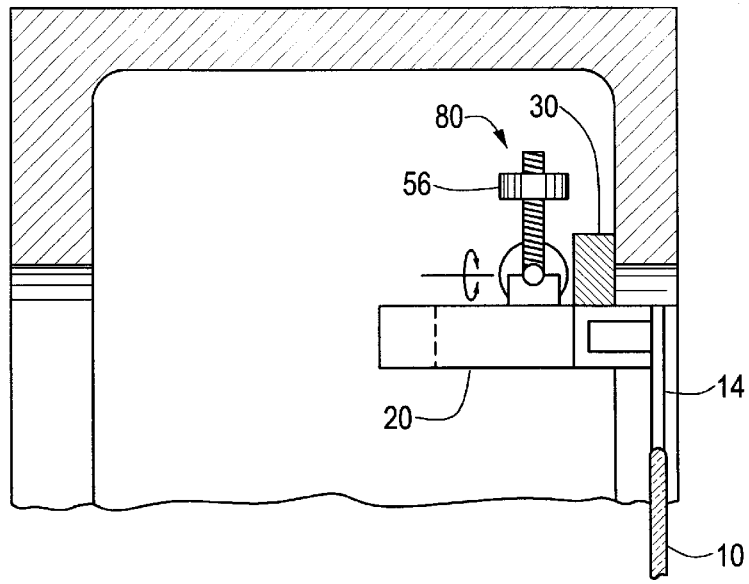
FIG. 6 is a schematic of the mounting of the support in the rotor cavity with the dynamic force compensation system according to the invention.

The dynamic force compensation system 80 according to the invention is mounted on support 20 inside cavity 42 as shown in FIG. 6. The compensation system 80 is thereby subjected to forces proportional to those experienced by the finger gripper/wafer interface but at a slightly greater distance from the center of the wafer 10. FIG. 5a illustrates the placement of compensation system components in relation to the support 20, while FIG. 5b more clearly illustrates the components of the system 80.

During operation, as the yoke 12 undergoes continually increasing/decreasing speeds or is subjected to an acceleration or deceleration (linear or angular) the weighted arms 66 lean or tilt to one of their sides resulting in a pushing or increase in the gripping force of the wafer. This increase helps to overcome the incipient slipping motions between the gripping finger 14 and the wafer 10. Then as the yoke settles at a steady angular speed (spinning speed), centrifugal forces acting on the finger 14 try to move the finger 14 away from the gripping direction. This attempted movement reduces the gripping force on the wafer 10. At the same time, the weighted arms 64 are acted on by the centrifugal force and try to move away from the wafer by pivoting on hinges 50. The result of this action is that the pushers 52 in turn press or push the finger 14 back towards the wafer. The actions described here are dynamic and act to compensate for the forces on the wafer continuously at all spinning speeds and angular acceleration/deceleration of yoke 12.

The dynamic compensation system 80 will now be explained in detail. It consists of two structures that are mirrored about the center of floating arm 26. The sides operate symmetrically, except that one side compensates for angular acceleration and the other compensates for angular deceleration. Operation of one side will be explained. A fulcrum 50a, is mounted on outer arm 22 at a predetermined position. This fulcrum 50a supports three masses—$M_a$ 56a, $M_c$ 54a and $M_f$ 52a, with $M_c$ and $M_f$ in a straight-line relationship and $M_a$ perpendicular to the other two. Mass $M_a$ 56a creates the dynamic compensating force for acceleration (deceleration on the other side). Mass $M_c$ 54a creates the dynamic compensating force for centrifugal force. Mass $M_f$ 52a is in contact with and transmits the compensating forces to the floating arm 26. Springs 32, having a spring constant $K_{weak}$, represent the constant force used to maintain contact between the finger 14 and the wafer 10 as in the prior art. Springs 70 and 72, having spring constants $K_1$ and $K_2$ respectively, assure that mass 52 maintains contact with the floating arm 26.

When the mechanism 80 is rotating in the direction indicated on FIG. 5b, centrifugal force pushes against floating arm 26 and against $M_c$ 54a. The force on $M_c$ lifts the mass in the direction of arrow Fc. Since $M_c$ and $M_f$ are rigidly held in a straight-line relationship, the lifting of $M_c$ exerts a downward force at $M_f$. The derivation in the Appendix shows how the values for the various masses and arm lengths are calculated for various configurations. When the counterpart mechanism (52b and 54b) is considered, each transfers half the force needed to compensate for the centrifugal force.

When the system 80 is accelerated from no rotation to the steady state rotational speed, acceleration forces act to cause the wafer 10 to slip in the finger's grip. Mass $M_a$ 56a acts to counteract this lifting force. As the wafer/mechanism starts rotating in the direction shown about leg 66a, $M_a$ 56a resists the motion by trying to rotate in the opposite direction, toward floating finger 26. This causes $M_f$ 52a to press downward against floating finger 26, exerting more force against the finger/wafer interface. When the system 80 is decelerated from the steady state rotational speed rest, deceleration forces act to weaken the grip on the wafer 10. $M_a$ 56b acts to counteract this lifting force. As the wafer/mechanism starts decelerating in the direction shown about leg 66b, $M_a$ 56b resists the motion by trying to rotate in the opposite direction, toward floating finger 26. This causes $M_f$ 52b to press downward against floating finger 26 exerting more force against the finger/wafer interface.

Figure 7:
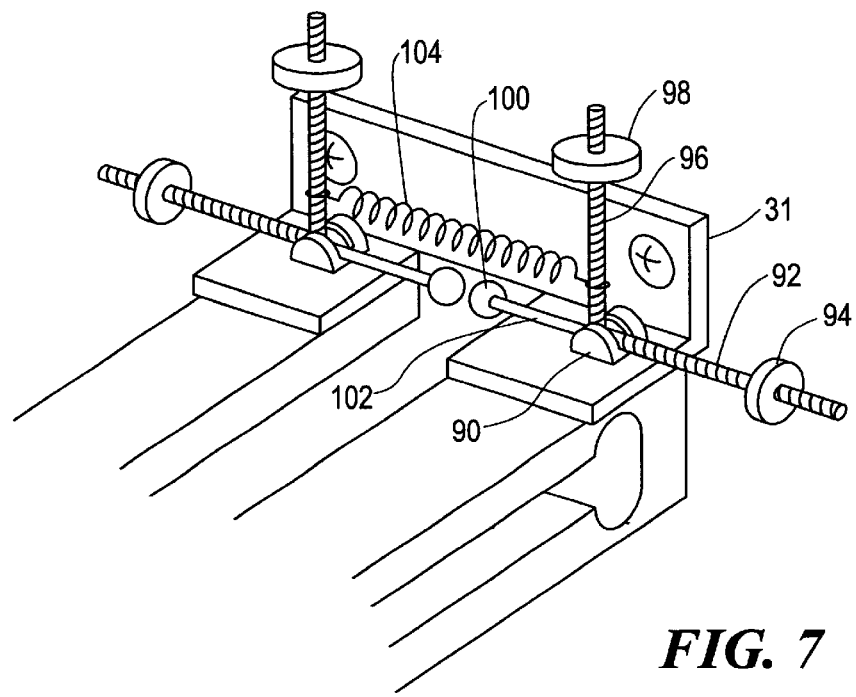
FIG. 7 is a schematic of one embodiment of the dynamic force compensation system according to the invention.

FIG. 7 illustrates one implementation of the invention. Here, the fulcrum 50 is implemented using a pivot 90, further illustrated in FIGS. 8c and 8d. Threaded arms 92 and 96 allow positioning of weights 94 and 98, implemented as an adjustable weight with a locking screw. Spring 104 provides tension to the arms 96, places a fixed bias on the pushers 100 and ensure that the mechanism 80 is chatter and backlash free. Mounting bracket 31 provides a mounting platform for the mechanism 80 and allows the entire mechanism 80 to be added to an existing mounting plate such as plate 30 for ease of installation.

Figure 8A:
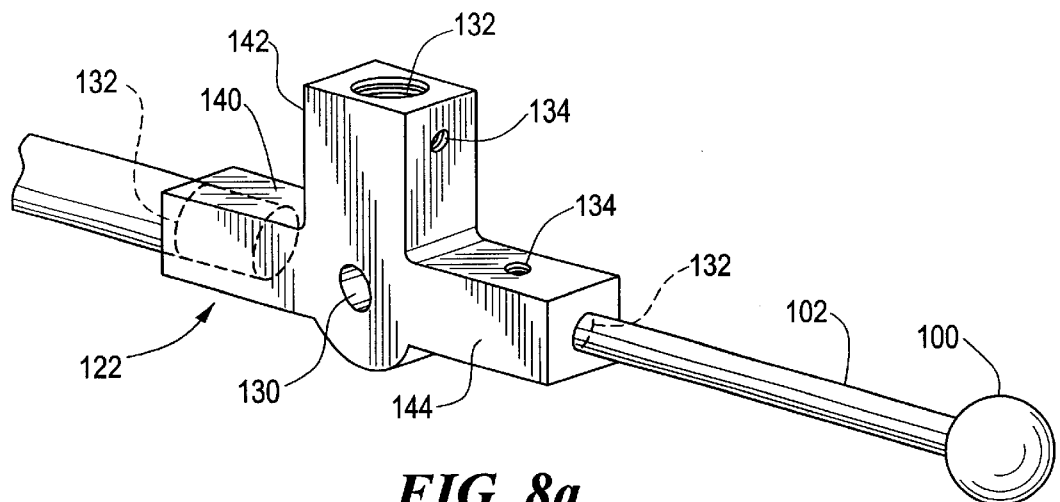
FIG. 8a is a detail of the pivot block of FIG. 7.
Figure 8B:
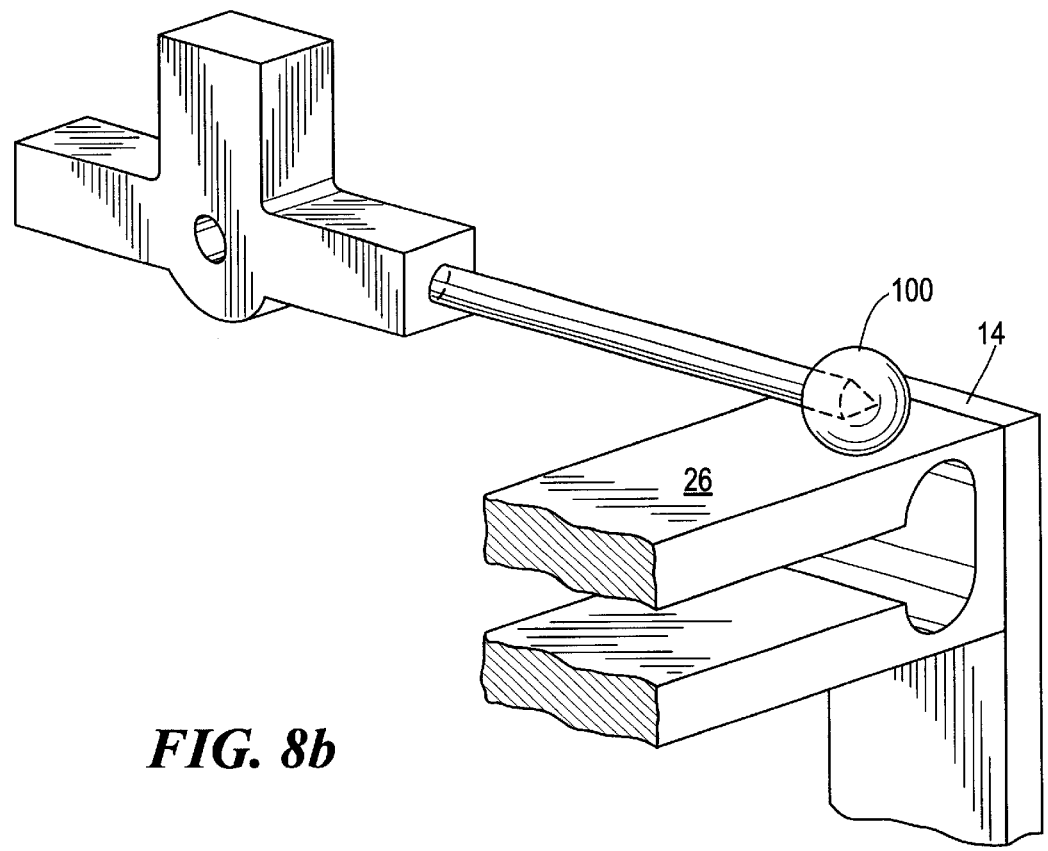
FIG. 8b is a detail of the force transmission mass according to FIG. 7.

FIG. 8a illustrates the central rocker 122 of pivot 90. Central rocker 122 may be made of machined or molded material and exhibits a rounded bottom surface to facilitate pivoting about a central shaft 112 (FIG. 8d). A central passageway 130 is provided to accommodate the central shaft 112. Three branches 140, 142, 144 are disposed at 90° increments about the top half of the central rocker 122. Each branch is tapped providing a socket 132 for the reception of a rod. The sockets may exhibit threads for securing and adjusting the positioning of the rods and may be outfitted with setscrew taps 134 for use of a setscrew for the securing and adjusting the positioning of the rods.

To facilitate pivoting, a ball bearing may be inserted in central passage 130 as illustrated in FIG. 8c. The bearing is sized such that the inner race 114 tightly fits against central shaft 112. Alternately, a journal bearing may be used in the pivot 90. The central shaft 112 rests in grooves in the pivot housing 110 as shown in FIG. 8d. Pusher weight 100 is at the end of shaft 102, spaced such that the pusher 100 rests on floating arm 26 inboard of the attachment point of the finger gripper 14. The weights 94 and 98 on the other two shafts 92 and 96, may be implemented as threaded split collars 140 as in FIG. 8f, the threading being used to adjust the location of the weight on the shaft. Spring 104 between shafts 96 is secured by looping the spring around a thread in shaft 96 as shown in FIG. 8e.

Figure 9:
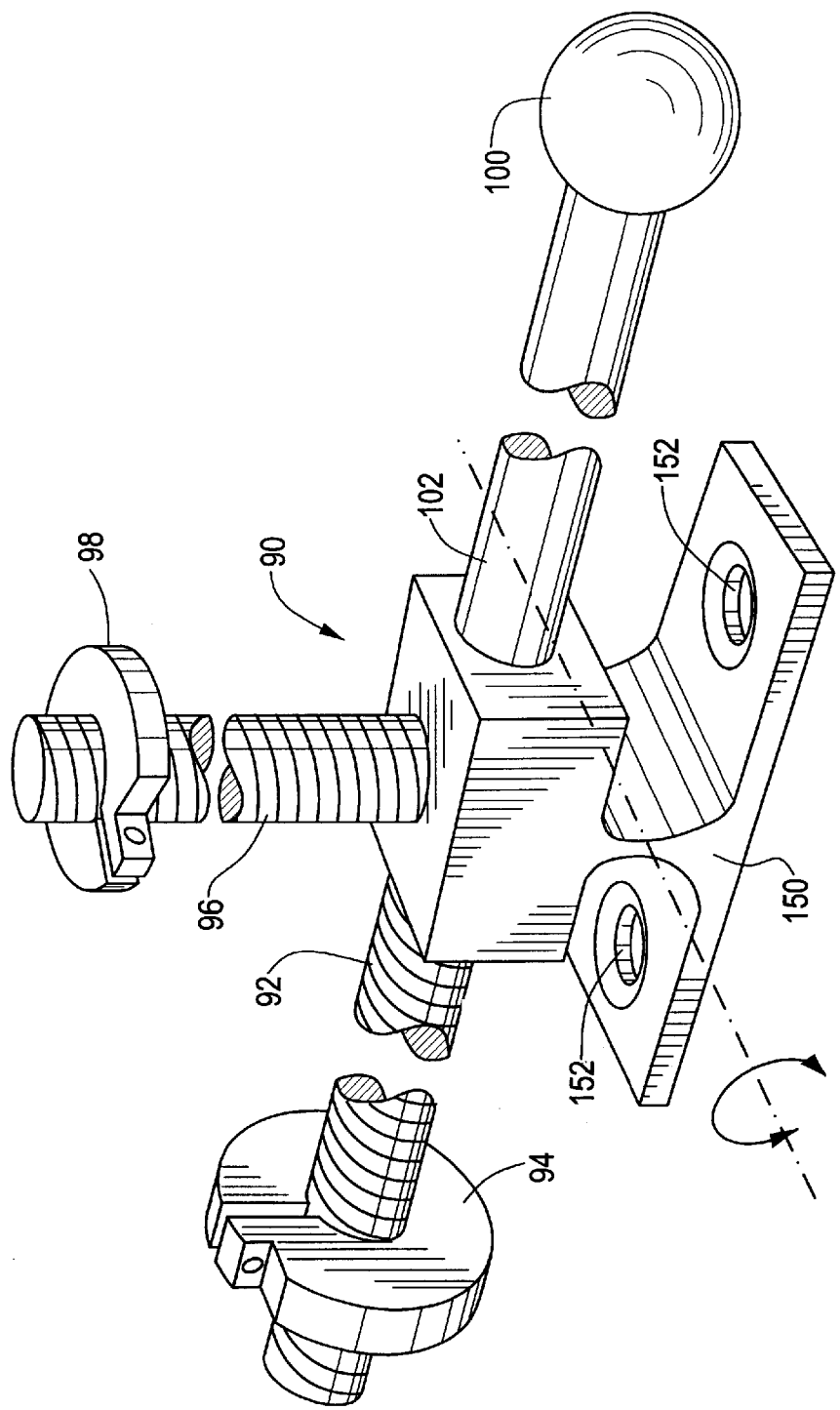
FIG. 9 is a schematic of a second embodiment of the dynamic compensation system according to the invention.

In a second aspect, the pivot 90 is implemented as a living hinge or flexure 150 as illustrated in FIG. 9. The hinge 150, made of flexure material that flexes in the direction indicated in FIG. 9 when force is placed on it, is particularly useful for areas where particulate contamination is of concern. Weight 94 causes the pusher 100 to be depressed when centrifugal force is present, while weight 98 causes the pusher 100 to be depressed when acceleration or deceleration is experienced. Because the pusher is not attached to the floating arm 26, there is no effect on floating arm 26 when the pusher 100 is lifted from the floating arm 26.

Both aspects described have the advantage that the positioning of the weights on the arms is adjustable such that their distance from the pivot 22 can be varied to make fine adjustments. The use of threaded shafts and/or set screws to position the weights further facilitates these adjustments.

While the invention has been described in relation to wafer holding by the edges, the principled described herein may be applied to other configurations of workpieces held in a rotary chuck.

Having described preferred embodiments of the invention it will now become apparent to those of ordinary skill in the art that other embodiments incorporating these concepts may be used. Accordingly, it is submitted that the invention should not be limited by the described embodiments but rather should only be limited by the spirit and scope of the appended claims.

APPENDIX

The attached derivation may be understood with reference to FIG. 5b that illustrates the components of the invention in schematic form. Two forces need to be countered, the lifting centrifugal force and the tangential force from acceleration and deceleration. Since forces are additive, each may be analyzed separately.

The mechanism uses the principle of the lever arm to compensate the forces generated due to the centrifugal force.

Legend $m_a$ is the mass to generate compensating forces to angular acceleration and deceleration.

$m_f$ is the mass equivalent of the arm 62 (Force Arm) which would impart the required stabilizing force on the gripper finger.

$m_c$ is the mass to generate compensating forces to varying centrifugal force on the gripper finger.

$K_1$ and $K_2$ are stiffness of the priming springs which will make sure that the 'Force Arms' are always in contact with the back of the gripper finger. It would be sufficient to have either one of them depending upon the mechanical convenience they provide.

$K_{weak}$ is the stiffness of the gripper pre-load spring, which ensures that there exists a minimum amount of gripping force between the finger and the wafer.

x is the pre-compression in the priming springs.

$\alpha$ is the angular acceleration/deceleration.

$F_c$ is the centrifugal force action on $m_c$.

F=centrifugal Force.

m=mass of a finger (single) [also it could be the mass of the floating arm].

$r_f$=the effective radius of the finger and floating arm center of mass from the center of the wafer (Near top of the finger).

$r_m$=the radius of the finger center of mass from the center of the wafer ($<r_f$).

g=32.3 ft/sec2—acceleration due to gravity.

s=rotational speed (rpm).

R=the nominal radius of rotation of the gripper mechanism (finger tip) from the center of the wafer $R=(r_f+r_m)/2$.

$\omega$=angular speed of the wafer rad/sec:=

$$\omega := s \frac{2\pi \text{rad}}{1\text{sec}}$$

$F_f$=Centrifugal force on the finger:=

$$F_f = m_{finger} \omega^2 r_f$$

$F_{bare}$=The minimum force to support a wafer without distortion.

$$F_{bare} := +K_1 \cdot (x)\left(\frac{l_{66}}{l_{62}}\right) + 2(K_{weak} \partial_{pre-comp})$$

Case A: Balancing the Angular Acceleration & Deceleration

Here the goal is to have the gripper impart a bare minimum force to the wafer in the form of supporting it, and when the wafer is subject to an angular acceleration or deceleration the gripping force is increased slightly or appropriately so that there is no slippage between the wafer and the gripper finger.

During the acceleration and deceleration of the wafer it is necessary that the gripper force be increased from $F_{base}$ to $F_{sufficient}$ to avoid slippage. The difference between $F_{bare}$ and $F_{sufficient}$ is generated by the action of $m_a$ alone. Using the moment balance equation, mass $m_a$ can be determined as follows:

At the instant of acceleration the $F_{sufficient}$ can be given by the following equation $$F_{sufficient} := m_a \cdot \alpha \cdot 1_{66} + F_{bare}$$

The 1$^{st}$ term determines the additional force that is required during acceleration and deceleration. Neglecting the infinitesimally small deflections in the springs $K_1$ and $K_{weak}$ at the instant of acceleration/deceleration and hence the forces generated due to them, and also the inertial effects of the spring connectors, $$m_a := \frac{(F_{sufficient} - F_{bare})(l_{62})}{[\alpha \cdot R \cdot (l_{62})]}$$

Note: In the event of Case A only one of the mass $m_a$ will be generating the compensating force, while the other one will be contributing no force in the mechanism, although there might be some pulling action on the spring $K_1$. For example, if $F_{bare}=1$ lbf $F_{sufficient}$ is the minimum gripping force required to avoid slippage, it depends on three elements:

- the inertial mass of the wafer $I_{wafer}$,
- angular acceleration and $\alpha$
- coefficient of friction between the $\mu_{wafer\text{-}finger}$
- gripper finger and the wafer edge it counteracts the tangential force at the periphery of the wafer and can be approximated as follows:

At the instant of acceleration the inertial torque generated by the wafer would be $$T_a := I_{wafer} \cdot \alpha$$

where $I_{wafer}$ is the mass moment of inertial of a 300 mm wafer given by $\alpha = 6 \pi n$ rad/sec$^2$ $$I_{wafer} := \left(\frac{1}{2}\right) \cdot m_{wafer}(r_{wafer})^2 \text{ if } M_{wafer} \; 0.14 \text{ kg and } r_{wafer} = 0.150 \text{ m}$$

then $I_{wafer}$ is $1.575 \cdot 10^{-3}$ kg-m$^2$
and $$T_a = I_{wafer}\alpha := \left(\frac{1}{2}\right) \cdot m_{wafer}(r_{wafer})^2 \alpha$$
$$= 0.03 \text{ N m}$$

Based on this torque, the tangential force at the periphery of the wafer is:

$$F_{tan} = \frac{T_a}{r_{wafer}}$$
$$F_{tan} = \frac{1}{2} m_{wafer} r_{wafer} \alpha$$
$$F_{tan} = 0.198 \text{ N}$$

Considering the coefficient of friction between the finger and the wafer, $$F_{sufficient} = \frac{F_{tan}}{\mu} = \frac{1}{2\mu} m_{wafer} r_{wafer} = 0.66 \text{ N}$$

For gripping force of $F_{bare}$ the resisting force for slippage would be $$F_{slippage} := F_{bare} \cdot \mu_{wafer\_fingers} \quad F_{slippage}=1.334 \cdot N$$

At the current configuration the $F_{slippage} > F_{sufficient}$ and hence there will be no slippage Assuming a reasonable values for some of the variables For example: assume that $F_{sufficient}$ is little higher than that is calculated above.

$$F_{sufficient\_new} := 2 \cdot F_{sufficient}$$

$l_{62}:=25.4$ mm $l_{66}:=25.4$ mm $$\alpha = 18.85 \frac{1}{s^2}$$

$R=0.179$ m $F_{sufficient\_new}=1.319$ N

The value of $m_a$ shows that it would be impossible for slippage to occur.

If still decide to try a mass $m_a$ on link $1_{66}$. The wafer would see the following magnitude of the force. $m_{anew}:=20$ gm $$F_{force\_on\_wafer} := M_{aneq} \cdot \alpha \cdot R \cdot \left(\frac{l_{66}}{l_{62}}\right)^{30} + F_{bare}$$

$F_{force\_on\_wafer}=1.015$ lbf

This means we can increase the mass even more if required.

Case B: Balancing the Centrifugal Force

Here we desire a constant equilibrium between the disturbing centrifugal force and the balancing or compensating force generated by the two masses $m_c$. When there is no centrifugal force, $F_{actual}=F_{bare}$ and when the centrifugal force is balanced out, $$F_{actual}=F_{bare}+F_{comp},$$

Since the fulcrum dictates that $m_f l_{62} = m_c l_{64}$, the compensating force generated by the masses $m_c$ must balance out the Centrifugal force.

$$2m_c[\cdot \omega^2 \cdot R \cdot (l_{64})] := m_{finger} \omega^2 r_f l_{62}$$

From the moment balance equation:
$$m_c := \frac{(F_{actual} - F_{bare}) \cdot (l_{62})}{[2 \cdot \omega^2 \cdot R \cdot (l_{64})]}$$

It should be noted that here both the masses $m_c$ will be contributing to counteract the $F_{actual}$.

From the above equations one can determine the magnitude of masses $m_a$ and $m_c$ with reasonable approximation. If $F_{actual}$—13.327N—The centrifugal force generated by the mass of the floating arm and the finger at 6 r.p.s $F_{bare}=4.448$—The bare gripping force desired, independent of speed.

From the above, it is clear that there is a force imbalance at 6 r.p.s.

Assuming reasonable values for some of the variables in the Equations.

$R=179.22$ mm $l_{62}=25.4$ mm $m_c:=20$ gm if s=6, $\omega=37.699$ Hz $F_{actual}=13.327$ N The actual centrifugal force acting on the Finger including Mechanism $F_{bare}=4.448$ N $$l_{64} := \frac{(F_{actual} - F_{bare})}{(2 \cdot m^2 \cdot \omega \cdot R)} \cdot (l_{62})$$

$l_{64}=22.135°$ m

I claim:

1. A force compensating apparatus for use in a wafer handling machine including a rotatable rim adapted to be concentric with and external to a wafer, a plurality of wafer supporting fingers disposed about said rim, each said finger supported by a floating arm that is a component of a support mechanism utilizing a duality of fixed arms bracketing said floating arm, said support mechanism attached to said rim by said fixed arms, each said finger preloaded with sufficient force to support said wafer among the plurality of fingers and each said finger generally positioned in a radial plane with said rim, said force compensating apparatus comprising:

a fulcrum mechanism disposed an a fixed arm;

a force receiving mass suspended on a first rod projecting from said fulcrum in a direction away from said floating arm; and a force transferring mass suspended on a second rod projecting from said fulcrum in a direction toward said floating arm;

wherein said fulcrum, said force receiving mass and said force transferring mass form a balance with said rods essentially parallel to said fixed and floating arms, and said force transferring mass contacting said floating arm.

2. The apparatus of claim 1 wherein said force receiving mass is oriented to be effected by centrifugal force when said rim of said wafer handling machine is rotated.

3. The apparatus of claim 2 wherein said balance functions such that said force transferring mass transfers a force inwardly on said floating arm sufficient to balance the centrifugal force on the finger.

4. The apparatus of claim 1 wherein said fulcrum is formed of a pivot device.

5. The apparatus of claim 1 wherein said fulcrum is formed as a living hinge.

6. The apparatus of claim 1 wherein the position of said force receiving mass and said force transferring mass are adjustable along the length of said first and second rods.

7. The apparatus of claim 1 wherein said force transferring mass is preloaded to maintain contact with said floating arm.

8. A method to compensate for forces exerted on a finger by a wafer handling machine including a rotatable rim adapted to be concentric with and external to a wafer, a plurality of wafer supporting fingers disposed about said rotatable rim, each said finger supported by a floating arm that is a component of a support mechanism utilizing a duality of fixed arms bracketing said floating arm, said support mechanism attached to said rotatable rim by said fixed arms, each said finger preloaded with sufficient force to support said wafer among the plurality of fingers and each said finger generally positioned in a radial plane with said rotatable rim, said method comprising:

disposing a fulcrum mechanism on a fixed arm;

suspending a force receiving mass on a first rod projecting from said fulcrum in a direction away from said floating arm; and suspending a force transferring mass on a second rod projecting from said fulcrum in a direction toward said floating arm, wherein said fulcrum, said force receiving mass and said force transferring mass form a balance with said rods essentially parallel to said fixed and floating arms, and said force transferring mass contacting said floating arm;

installing a wafer in said plurality of fingers;

accelerating said rotatable rim to a predetermined angular velocity while said balance dynamically exerts sufficient force on said floating arm to counteract the centrifugal force on said finger;

maintaining said predetermined angular velocity while said balance dynamically exerts sufficient force on said floating arm to counteract the centrifugal force on said finger; and decelerating said rotatable rim from said predetermined angular velocity while said balance dynamically exerts sufficient force on said floating arm to counteract the centrifugal force on said finger.

9. A force compensating apparatus for use in a wafer handling machine including a rotatable rim adapted to be concentric with and external to a wafer, a plurality of wafer supporting fingers disposed about said rim, each said finger supported by a floating arm that is a component of a support mechanism utilizing a first and second fixed arms bracketing said floating arm, said support mechanism attached to said rim by said fixed arms, each said finger preloaded with sufficient force to support said wafer among the plurality of fingers and each said finger generally positioned in a radial plane with said rim, said force compensating apparatus comprising:

a fulcrum mechanism disposed on each fixed arm;

a first force receiving mass suspended on a first rod projecting from said fulcrum in a direction away from said floating arm;

a second force receiving mass suspended on a second rod projecting from said fulcrum in a radial direction; and a force transferring mass suspended on a third rod projecting from said fulcrum in a direction toward said floating arm;

wherein said fulcrum, said first force receiving mass and said force transferring mass form a balance with said rods essentially parallel to said fixed and floating arms, and said force transferring mass contacting said floating arm while said fulcrum, said second force receiving mass and said force transferring mass form a rigid triangle.

10. The apparatus of claim 9 wherein said first force receiving mass is oriented to be effected by centrifugal force when said rim of said wafer handling machine is rotated.

11. The apparatus of claim 10 wherein said balance functions such that said force transferring mass transfers a force inwardly on said floating arm sufficient to balance the centrifugal force on the finger.

12. The apparatus of claim 9 wherein said triangle on said first fixed arm functions such that said force transferring mass transfers a force inwardly on said floating arm sufficient to balance the lifting acceleration force on the finger and said triangle on said second fixed arm functions such that said force transferring mass transfers a force inwardly on said floating arm sufficient to balance the lifting deceleration force on the finger.

13. The apparatus of claim 9 wherein said fulcrum is formed of a pivot device.

14. The apparatus of claim 9 wherein said fulcrum is formed as a living hinge.

15. The apparatus of claim 9 wherein the position of said force receiving masses and said force transferring mass are adjustable along the length of said first, second and third rods respectively.

16. The apparatus of claim 9 wherein said force transferring mass is preloaded to maintain contact with said floating arm.

* * * * *

UNITED STATES PATENT AND TRADEMARK OFFICE
CERTIFICATE OF CORRECTION

PATENT NO.    : 6,260,899 B1
DATED         : July 17, 2001
INVENTOR(S)   : Anil Mankame It is certified that error appears in the above-identified patent and that said Letters Patent is hereby corrected as shown below:

Column 7,
Line 25, "πn" should read -- π --;
Line 55, "$F_{slippage} := F_{bare} \cdot \mu_{wafer\_finger5} F_{slippage} = 1.334 \cdot N$" should read
-- $F_{slippage} := F_{bare} \cdot \mu_{wafer\_finger} F_{slippage} = 1.334 \cdot N$ --;
                                         5

Column 8,
Line 15,
" $F_{force\_on\_wafer} := M_{aneq} \cdot \alpha \cdot R \cdot \left(\frac{1_{66}}{1_{62}}\right)^{30} + F_{bare}$ "

should read  -- $F_{force\_on\_wafer} := M_{anew} \cdot \alpha \cdot R \cdot \left(\frac{1_{66}}{1_{62}}\right)^{30} + F_{bare}$ --;

Column 9,
Line 10, "water" should read -- wafer --; and
Line 13, "an a fixed" should read -- on a fixed --.

Signed and Sealed this

Eleventh Day of January, 2005

JON W. DUDAS
*Director of the United States Patent and Trademark Office*